(12) United States Patent
Chen et al.

(10) Patent No.: US 7,948,037 B2
(45) Date of Patent: *May 24, 2011

(54) MULTIPLE-GATE TRANSISTOR STRUCTURE AND METHOD FOR FABRICATING

(75) Inventors: Hao-Yu Chen, Kaohsiung (TW); Yee-Chia Yeo, Singapore (SG); Fu-Liang Yang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/758,953

(22) Filed: Apr. 13, 2010

(65) Prior Publication Data
US 2010/0200923 A1      Aug. 12, 2010

Related U.S. Application Data

(62) Division of application No. 10/314,249, filed on Dec. 6, 2002, now Pat. No. 7,728,360.

(51) Int. Cl.
    *H01L 29/66* (2006.01)
(52) U.S. Cl. ................... 257/365; 257/E29.264
(58) Field of Classification Search ............... 257/202, 257/308, 365, 722, E21.014, E29.264
See application file for complete search history.

(56) References Cited

U.S. PATENT DOCUMENTS

| | | | |
|---|---|---|---|
| 6,413,802 B1 | 7/2002 | Kedzierski et al. | |
| 6,475,869 B1 | 11/2002 | Yu | |
| 6,562,491 B1 | 5/2003 | Jeon | |
| 6,768,158 B2 | 7/2004 | Lee | |
| 6,833,588 B2 | 12/2004 | Yu et al. | |
| 6,855,990 B2 | 2/2005 | Hu et al. | |
| 6,864,519 B2 | 3/2005 | Yeo et al. | |
| 7,728,360 B2 * | 6/2010 | Chen et al. | 257/202 |
| 2002/0011612 A1 | 1/2002 | Hieda | |
| 2003/0042531 A1 | 3/2003 | Lee | |
| 2004/0036126 A1 | 2/2004 | Chau et al. | |

* cited by examiner

*Primary Examiner* — Tom Thomas
*Assistant Examiner* — Monica D Harrison
(74) *Attorney, Agent, or Firm* — Thomas | Kayden

(57) ABSTRACT

A multiple-gate transistor structure which includes a substrate, source and drain islands formed in a portion of the substrate, a fin formed of a semi-conducting material that has a top surface and two sidewall surfaces, a gate dielectric layer overlying the fin, and a gate electrode wrapping around the fin on the top surface and the two sidewall surfaces separating source and drain islands. In an alternate embodiment, a substrate that has a depression of an undercut or a notch in a top surface of the substrate is utilized.

18 Claims, 3 Drawing Sheets

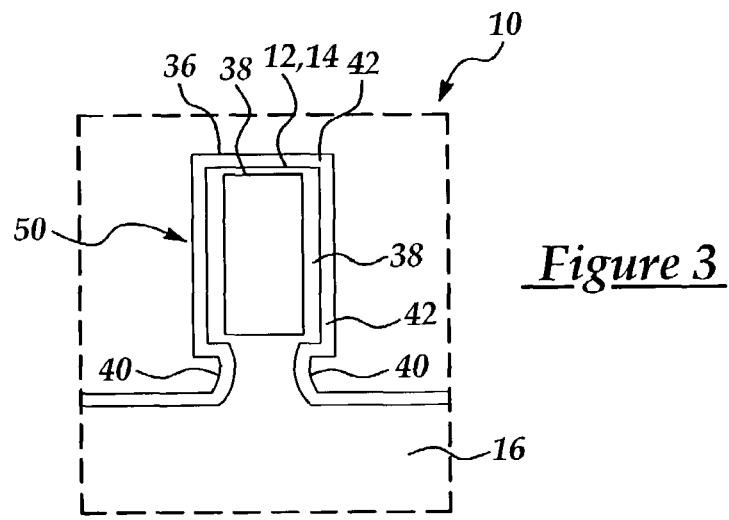
*Figure 3*
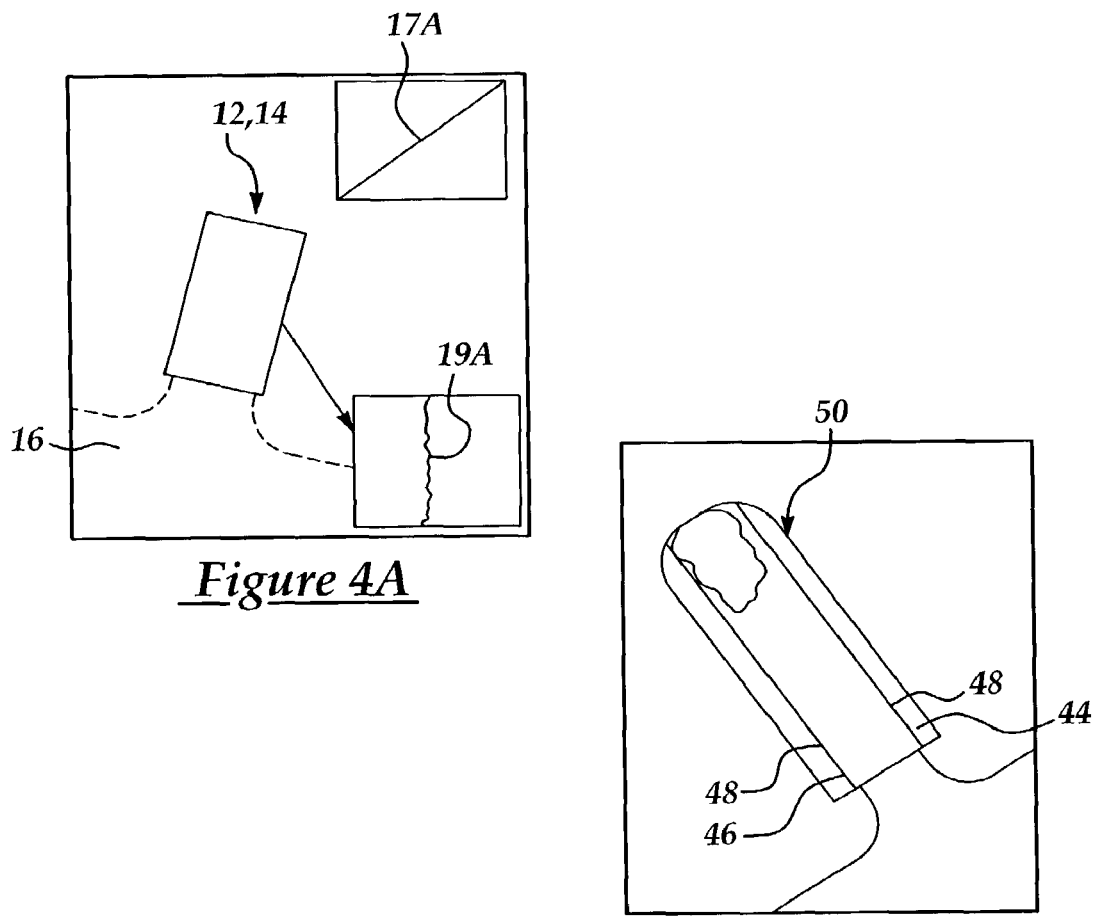
*Figure 4A*
*Figure 4B*

MULTIPLE-GATE TRANSISTOR STRUCTURE AND METHOD FOR FABRICATING

CROSS REFERENCE TO RELATED APPLICATIONS

This application is a Divisional of pending U.S. patent application Ser. No. 10/314,249, filed on Dec. 6, 2002 the entirety of which is/are incorporated by reference herein.

FIELD OF THE INVENTION

The present invention generally relates to a multiple-gate transistor and method for fabricating and more particularly, relates to a multiple-gate semiconductor structure equipped with a gate electrode that wraps around a semiconductor fin on its top and sidewall surfaces separating a source and a drain region of the transistor and method for fabricating the structure.

BACKGROUND OF THE INVENTION

As the gate length of the MOSFET is scaled down into the sub-50 nm regime for improved performance and density, the requirements for body-doping concentration, gate oxide thickness, and source/drain (S/D) doping profiles to control short-channel effects become increasingly difficult to meet when conventional device structures based on bulk silicon (Si) substrates are employed. The heavy channel doping required to provide adequate suppression of short-channel effects results in degraded mobility and enhanced junction leakage. The aggressive reduction of the silicon dioxide $SiO_2$ gate dielectric thickness for reduced short-channel effects and improved drive current leads to increased direct tunneling gate leakage current and standby power consumption, and also raises concerns regarding the gate oxide reliability. For device scaling well into the sub-50 nm regime, a promising approach to controlling short-channel effects is to use an alternative device structure with multiple-gates, such as the double-gate and the surround-gate or wrap-around gate structure.

A simple example of a multiple-gate device is the double-gate MOSFET structure, where there are two gate electrodes on the opposing sides of the channel. There are several ways in which a double-gate structure can be implemented. One way is the vertical-channel double-gate MOSFET. This is described by U.S. Pat. No. 6,372,559 B1 issued to Crowder et al. for a method of fabricating a self-aligned vertical double-gate MOSFET, and by U.S. Pat. No. 6,406,962 B1 issued to Agnello et al. for a vertical trench-formed dual-gate FET device structure and method for fabrication. A common feature of these two methods is that the source-to-drain direction is oriented normal to the plane of the substrate surface, and the gate-to-gate direction is parallel to the plane of the substrate surface. The device fabrication processes for such a double-gate structure are typically complicated, costly and suffer from poor manufacturability.

Another method to fabricate a double-gate MOSFET is described by U.S. Pat. No. 6,413,802 B1 issued to Hu et al. for fin FET transistor structures having a double gate channel extending vertically from a substrate and methods for manufacture. In U.S. Pat. No. 6,413,802 B1, the device channel comprises a thin silicon fin formed on an insulative substrate (e.g., silicon oxide) and defined using an etchant mask. Gate oxidation is performed, followed by gate deposition and gate patterning to form a double-gate structure overlying the sides of the fin. Both the source-to-drain direction and the gate-to-gate direction are in the plane of the substrate surface. This device structure is widely recognized to be one of the most manufacturable double-gate structures. An integral feature of the double-gate MOSFET described in U.S. Pat. No. 6,413,802 B1 is the etchant mask on the silicon fin. The retention of the etchant mask is crucial due to problems faced in the etch process, particularly relating to the etch selectivity of the gate electrode with respect to the gate dielectric during the gate patterning step.

It is therefore an object of the present invention to provide a multiple-gate transistor structure and a method for fabricating the structure that allows transistor scaling beyond the limits of the conventional bulk silicon MOSFET.

SUMMARY OF THE INVENTION

In accordance with the present invention, a multiple-gate semiconductor structure and a method for fabricating the structure are provided.

In a preferred embodiment, a multiple-gate semiconductor structure is provided which includes a substrate; source and drain islands formed in a portion of the substrate; a fin formed of a semi-conducting material having a top surface and two sidewall surfaces connecting the semiconductor source and drain islands; a gate dielectric layer overlying the fin; and a gate electrode wrapping around the fin on the top surface and the two sidewall surfaces of the fin separating the source and drain islands.

In the multiple-gate semiconductor structure, the semiconducting material may be silicon, or may be silicon and germanium. The fin may be rounded at two top corners. The gate dielectric layer may include silicon oxide, silicon oxynitride, or a high permittivity material selected from the group consisting of $La_2O_3$, HfON, $Al_2O_3$, $HfO_2$ and $ZrO_2$. The relative permittivity of the high permittivity material may be at least 5. The gate dielectric layer may have a thickness between 3 Å and 100 Å. The gate dielectric layer may have a first thickness on the fin sidewall surfaces and a second thickness on the fin top surface, wherein the first thickness is different from the second thickness. The second thickness may be smaller than the first thickness. The gate dielectric layer may have a thickness on the top surface of the fin less than 20 Å.

The gate electrode may be formed of poly-crystalline silicon, or may be formed of poly-crystalline silicon germanium, or may be formed of a metal. The source and drain islands each may include a lightly doped or extension region. The source and drain islands may be strapped by a conductive material selected from the group consisting of metals and suicides. Contacts between the conductive material and the source and drain islands are made on at least one of the sidewall and top surfaces of the fin.

The present invention is further directed to a multiple-gate semiconductor structure that includes a substrate that has a depression in a top surface, the depression includes an undercut or a notch; a fin formed of a semi-conducting material and has a top surface and two sidewall surfaces, the fin is positioned vertically juxtaposed to the depression in the top surface of the substrate; source and drain regions formed in the semi-conducting material of the fin; a gate dielectric layer overlying the fin; and a gate electrode wrapping around the fin on the two sidewall surfaces, the top surface and a bottom of a base of the fin separating the source and drain regions.

In the multiple-gate semiconductor structure, the semiconducting material may include silicon, or may include silicon and germanium. The fin may be rounded at two top corners, or may have two square corners. The gate dielectric layer may include silicon oxide, may include silicon oxynitride, or may include a high permittivity material selected from the group consisting of $La_2O_3$, HfON, $Al_2O_3$, $HfO_2$ and $ZrO_2$. The relative permittivity may be at least 5. The gate dielectric layer may have a thickness between 3 Å and 100 Å. The gate dielectric layer may have a first thickness on the fin sidewall surfaces and a second thickness on the fin top surface, wherein the first thickness may be different from the second thickness. The second thickness may be smaller than the first thickness. The gate dielectric layer may have a thickness on the top surface of the fin less than 20 Å.

In the multiple-gate semiconductor structure, the gate electrode may include poly-crystalline silicon, may include poly-crystalline silicon germanium, or may include a metal. The source and drain islands may each include a lightly doped or extension region. The source and drain islands may be strapped by a conductive material selected from the group consisting of metals and silicides. Contacts between the conductive material and the source and drain islands may be made on at least one of the sidewall and top surfaces of the fin.

The present invention is still further directed to a method for fabricating a multiple-gate semiconductor structure which includes the steps of providing a substrate that includes a semi-conducting layer overlying an insulating layer; patterning and forming a fin in the semi-conducting layer, the fin has two sidewall surfaces and a top surface; depositing a layer of a dielectric material overlying the fin; depositing a layer of a conductive material overlying the layer of dielectric material; patterning the layer of conductive material forming a gate straddling across the two sidewall surfaces and the top surface of the fin; and forming a source and a drain region in the semi-conducting layer.

The method for fabricating a multiple-gate semiconductor structure may further include the step of forming the semi-conducting substrate in a material including silicon, or in a material including silicon and germanium. The method may further include the step of forming the layer of dielectric material in silicon oxide. The fin forming process may further include a fin surface smoothing step, wherein the fin surface smoothing step may further include sub-steps of sacrificial oxidation and high temperature annealing in a hydrogen ambient. The method may further include the step of forming the dielectric layer in a material including silicon oxide, or silicon oxynitride, or a high permittivity material selected from the group consisting of $La_2O_3$, HfON, $Al_2O_3$, $HfO_2$ and $ZrO_2$. The high permittivity material may have a relative permittivity of at least 5.

The method may further include the step of forming the gate dielectric layer to a thickness between 3 Å and 100 Å. The method may further include the step of forming a different thickness of the dielectric layer on the sidewall surfaces and on the top surface of the fin, or the step of forming the gate dielectric layer to a smaller thickness on the top surface of the fin compared to the gate dielectric layer on the sidewall surfaces of the fin. The method may further include the step of forming the gate dielectric layer on the top surface of the fin to a thickness of less than 20 Å. The method may further include the step of forming the gate in a material including poly-crystalline silicon, or poly-crystalline silicon germanium. The method may further include the step of forming the source or drain region in a lightly doped or extension region. The method may further include the step of forming a layer of a conductive material on top of the source and drain regions, or forming the layer of conductive material in a material selected from the group consisting of metal, metallic silicide and metallic nitride.

The present invention is still further directed to a method for fabricating a multiple-gate semiconductor structure that include the steps of providing a substrate that includes a semi-conducting layer overlying an insulating layer; patterning and forming a fin in the semi-conducting layer, the fin has two sidewall surfaces and a top surface; forming a depression in a top surface of the substrate at a base of the fin; depositing a layer of a dielectric material overlying the fin; depositing a layer of a conductive material overlying the layer of dielectric material; patterning the layer of conductive material forming a gate straddling across the two sidewall surfaces and the top surface of the fin; and forming a source and a drain region in the semi-conducting layer.

The method for fabricating a multiple-gate semiconductor structure may further include the step of forming the depression in the top surface of the substrate by undercutting at the base of the fin, or the step of forming the depression by undercutting using an etch process. The method may further include the step of forming a layer of a conductive material on top of the source and drain regions, or forming the layer of conductive material selected from the group consisting of metal, metallic silicide and metallic nitride.

BRIEF DESCRIPTION OF THE DRAWINGS

These and other objects, features and advantages of the present invention will become apparent from the following detailed description and the appended drawings in which:

FIG. 3 is an enlarged, cross-sectional view illustrating an alternate embodiment of the present invention wherein the buried oxide layer under the silicon fins is undercut or notched by an etch process.

FIGS. 4A and 4B are illustrations of micrographs obtained in a cross-sectional transmission electron microscopy image.

DETAILED DESCRIPTION OF THE PREFERRED EMBODIMENT

Figure 1A:
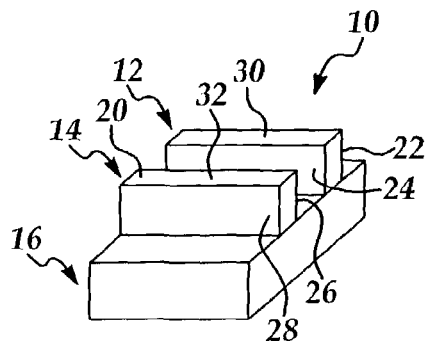
FIGS. 1A, 1B and 1C are enlarged, perspective views illustrating a fabrication process for the present invention multiple-gate structure wherein two silicon fins are patterned and formed on a substrate with an insulating layer inbetween the fins and the substrate.

The present invention relates to the field of semiconductor devices and to the manufacture of field effect transistors with multiple-gates for scaling of the complementary metal-oxide-semiconductor (CMOS) technology well into the sub-50 nanometer (nm) regime.

Metal-oxide-semiconductor field effect transistor (MOSFET) technology is the dominant semiconductor technology used for the manufacture of ultra-large scale integrated (ULSI) circuits. Reduction in the side of MOSFETs has provided continued improvement in speed performance, circuit density, and cost per unit function over the past few decades. As the gate length of the MOSFET is reduced, the source and drain increasingly interact with the channel and gain influence on the channel potential. Consequently, a transistor with a short gate length suffers from problems related to the inability of the gate to substantially control the on and off states of the channel. Phenomena such as reduced gate control associated with transistors that have short channel lengths are termed short-channel effects. Increased body doping concentration, reduced gate oxide thickness, and ultra-shallow source/drain junctions are ways to suppress short-channel effects. However, for device scaling well into the sub-50 nm regime, the requirements for body-doping concentration, gate oxide thickness, and source/drain (S/D) doping profiles become increasingly difficult to meet when conventional device structures based on bulk silicon (Si) substrates are employed. The heavy channel doping required to provide adequate suppression of short-channel effects results in degraded mobility and enhanced junction leakage. The aggressive reduction of the silicon dioxide $SiO_2$ gate dielectric thickness for reduced short-channel effects and improved drive current leads to increased direct tunneling gate leakage current and standby power consumption, and also raises concerns regarding the gate oxide reliability. Innovations in front-end process technologies or the introduction of alternative device structures are required to sustain the historical pace of scaling.

To extend the scalability of CMOS technology beyond the limitations of the conventional bulk MOSFET and to realize the ultimate limit of silicon MOSFETs, a multiple-gate device structure should be used. The introduction of additional gates improves the capacitance coupling between the gates and the channel, increases the control of the channel potential by the gate, helps suppress short channel effects, and prolongs the scalability of the MOS transistor.

In the present invention, a fabrication process that overcomes the process difficulties faced in U.S. Pat. No. 6,413, 802 is disclosed in which the use of an etchant mask after the fin formation process is eliminated. In addition, the process improvement to be described in the present invention method results in a multiple-gate structure that substantially wraps around a silicon fin or a transistor channel. The multiple-gate structure is superior in performance to those described in the prior art references. Moreover, the fabrication process is superior or more manufacturable when compared to the prior art methods.

Figure 1B:
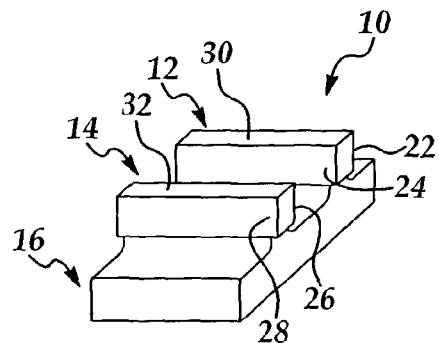
Figure 1C:
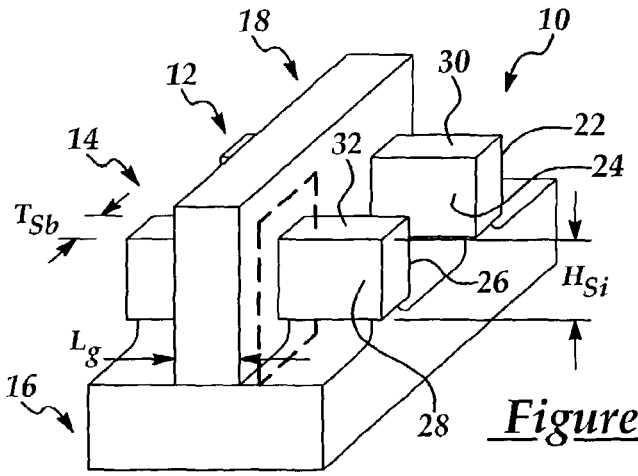
Figure 2A:
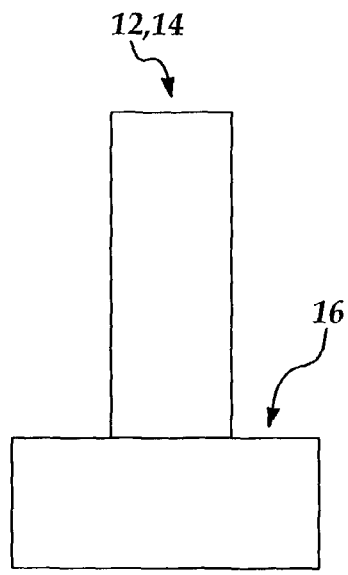
FIGS. 2A and 2B are enlarged, cross-sectional views illustrating the shapes of the silicon fins having square corners and rounded corners, respectively.
Figure 2B:
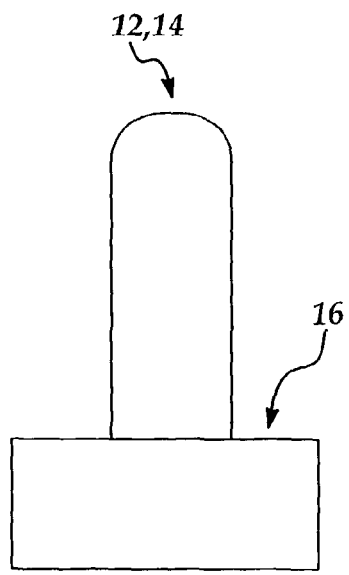

A process flow for fabricating the present invention multiple-gate structure 10 is schematically illustrated in FIGS. 1A, 1B and 1C. The silicon fins 12,14 are formed of a semiconducting material, such as Si on top of an insulating material layer 16, i.e., buried oxide, and patterned using an etchant mask (not shown). The etchant mask may include a material commonly used for masking an etch process, such as photoresist, silicon oxide, silicon nitride, etc. In a preferred embodiment, the etchant mask is silicon oxide. In the present invention method, an optional fin surface smoothing step is used to improve or reduce the surface roughness of the fin sidewalls. When the etchant mask used for fin definition is silicon oxide, as in the preferred embodiment, it is removed either before or after the fin smoothing process. The removal of the etchant mask on the silicon fins 12,14 prior to gate dielectric 20 formation allows the device to have at least a triple-gate structure since the gate electrode 18 will finally be formed on each of the two sidewalls 22, 24, 26, 28 as well as the top surfaces 30,32 of the fins 12,14. If the etchant mask used for fin definition is a photoresist, it has to be removed before the fin surface smoothing step to avoid the high temperatures used in the fin smoothing process. The fin surface smoothing is performed by subjecting the fins 12,14 to a sacrificial oxidation and/or silicon sidewall treatment (e.g., high temperature anneal at 1000.degree. C. in $H_2$ ambient). The surface smoothing of the fin sidewalls contributes to the achievement of good carrier mobilities. Depending on whether the silicon oxide etchant mask is removed prior to the fin smoothing step, the shape of the fin may be square-like or rounded at the top. This is illustrated in FIGS. 2A and 2B.

In an alternate embodiment, the buried oxide 16 under the silicon fins 12, 14 is undercut or notched by using an etch process. The etch process can be a plasma etch or a wet etch using dilute hydrofluoric acid (HF). The undercut 40 (or notch) of the substrate insulating layer underlying the silicon fins 12, 14 allows the formation of an omega-shaped gate electrode 36 as depicted in FIG. 3. The feature allows additional capacitance coupling between the gate and the channel underneath the fin, and the structure thus emulates a wrap-around gate but avoids the process difficulties associated with the implementation of the wrap-around structure. The preceding description completes the fin formation.

The present invention process is followed by gate dielectric 38 formation. The gate dielectric 38 may be formed by thermal oxidation, chemical vapor deposition, sputtering, etc. In general, the thickness of the gate dielectric may be different on the sidewalls 22, 24, 26, 28 of the fin and the tops 30,32 of the fin. Depending on the technique of gate dielectric formation, the gate dielectric thickness on the tops 30,32 of the fin may be thinner than the thickness on the fin sidewalls 22, 24, 26, 28. In one embodiment, the gate dielectric thickness on the top surfaces 30,32 of the fin is less than 20 Å. The gate dielectric may include a conventional material such as silicon dioxide or silicon oxynitride with a thickness ranging from 3 Å to 100 Å, preferably 10 Å or less. The gate dielectric may also include a high permittivity (high-k) material such as aluminum oxide $Al_2O_3$, hafnium oxide $HfO_2$, zirconium oxide $ZrO_2$, with an equivalent oxide thickness of 3 Å to 100 Å. A cross-sectional transmission electron spectroscopy (TEM) image of the silicon fin 12,14 after gate dielectric 38 formation is shown in FIG. 4A. The TEM image shows a fin that is 55 nm tall, 25 nm wide, and stands on an undercut buried oxide.

Next, the gate material 42 is deposited. The gate material may be polycrystalline-silicon (poly-Si), poly-crystalline silicon germanium (poly-SiGe), a refractory metal such as molybdenum and tungsten, compounds such as titanium nitride, or other conducting materials. A gate mask (not shown) is defined and the underlying gate material 42 is etched to form the gate electrode 36. The gate etch stops on the gate oxide, and the gate is electrically isolated from the transistor structure by the gate oxide. In the preferred embodiment, the gate material is poly-Si and the gate oxide is silicon oxynitride. A plasma etch using chlorine and bromine chemistry may be used to achieve a high etch selectivity in excess of 2000. A high etch selectivity is critical for device structures with a tall fin and aggressively scaled gate oxide thickness. After the definition of the gate 50, the masking material can be removed. The lightly-doped drain (LDD) or drain extension is formed next. This may be achieved by ion implantation, plasma immersion ion implantation (PIII), or other techniques known and used in the art. Next, a spacer 48 is formed on each of the sidewalls 44,46 of the gate 50 and the channel by deposition and selective etching of the spacer material. The spacer material may include a dielectric material such as silicon nitride or silicon dioxide as illustrated in FIG. 4B.

In the preferred embodiment, the spacer 48 is a silicon nitride/oxide composite spacer. After spacer 48 formation, source and drain regions (not shown) are doped by ion implantation, PIII, gas or solid source diffusion, or any other techniques known and used in the art. Any implant damage or amorphization can be annealed through subsequent exposure to elevated temperatures. The resistance of the source, drain, and gate 50 can also be reduced by strapping the source, drain, and gate 50 with a conductive material. The conductive material may be a metallic silicide such as titanium silicide, cobalt silicide, or nickel silicide, a metallic nitride such as titanium nitride and tantalum nitride, a metal such as tungsten and copper, or a heavily doped semiconductor such as n+ doped Si. In the preferred embodiment, the conductive material is cobalt silicide which may be formed by a self-aligned silicide (salicide) process. The cobalt-silicided poly-Si gate is shown in FIG. 4B. In the source and drain regions, the conductive material may be formed on both the top of the fin as well as the sidewall of the fin.

Figure 5A:
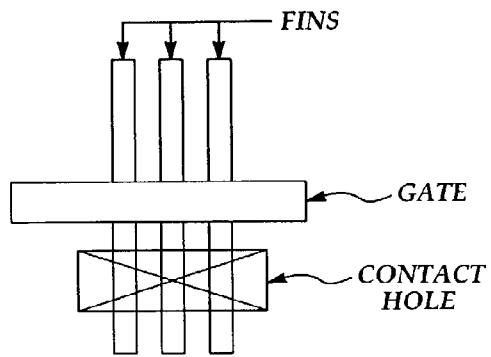
FIGS. 5A and 5B are enlarged, plane views showing contact layouts for the present invention semiconductor structures.
Figure 5B:
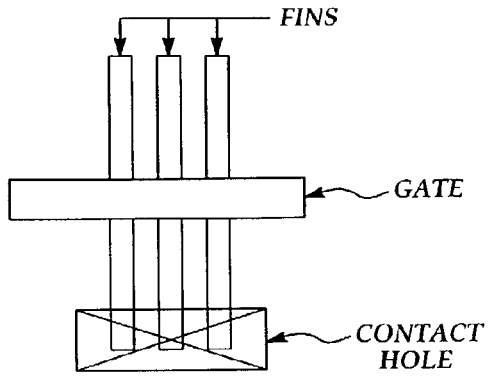

Next, contacts are formed to the source, drain and gate regions using techniques known and used in the art. It is important to achieve a very low contact resistance in nanoscale devices. One way to reduce the contact resistance is to increase the contact area by making contact with the fin sidewall. The contact layout (top view) shown in FIGS. 5A and 5B may be used.

Figure 6A:
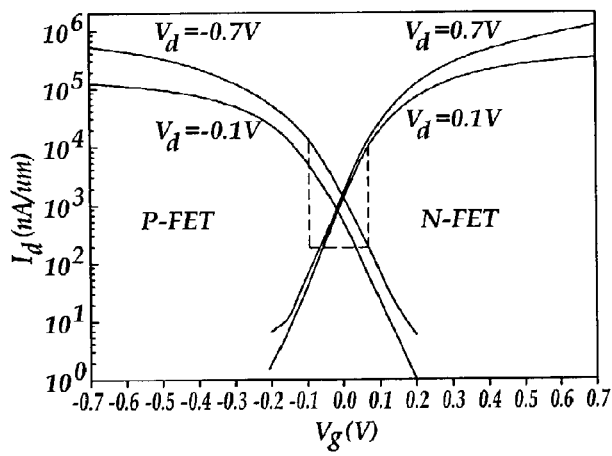
FIGS. 6A and 6B are graphs illustrating drain current versus gate voltage curves for the present invention multiple-gate N-channel and P-channel MOSFETs, respectively.
Figure 6B:
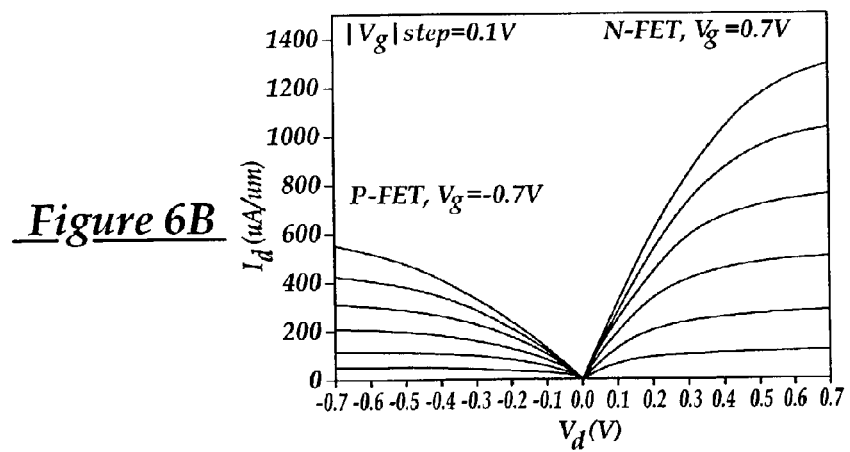

In FIG. 6A, the drain current versus gate voltage of the multiple-gate N-channel and P-channel MOSFETs with gate lengths of 25 nm are shown. N+ and P+ dual poly-Si gates are adopted for N- and P-channel MOSFETs, respectively. At a supply voltage of 0.7 V, the drive currents for the N- and P-channel devices are 1300 mA/μm and 550 mA/μm, respectively, as shown in FIG. 6B. For a supply voltage of 1 V, in-situ doped N+ poly gate may be used for both the N- and P-channel transistors.

While the present invention has been described in an illustrative manner, it should be understood that the terminology used is intended to be in a nature of words of description rather than of limitation.

Furthermore, while the present invention has been described in terms of a preferred and an alternate embodiment, it is to be appreciated that those skilled in the art will readily apply these teachings to other possible variations of the inventions.

The embodiment of the invention in which an exclusive property or privilege is claimed are defined as follows.

What is claimed is:

1. A multiple-gate semiconductor structure comprising:
a substrate having a depression in a top surface, said depression comprises an undercut or a notch;
a fin formed of a semi-conducting material having a top surface and two sidewall surfaces, said fin being positioned vertically juxtaposed to said depression in said top surface of the substrate;
source and drain regions formed in said semi-conducting material of said fin;
a gate dielectric layer overlying said fin; and
a gate electrode wrapping around said fin on said two sidewall surfaces, said top surface, and a bottom of a base of said fin separating said source and drain regions.

2. The multiple-gate semiconductor structure of claim 1, wherein said semi-conducting material comprises silicon.

3. The multiple-gate semiconductor structure of claim 1, wherein said semi-conducting material comprises silicon and germanium.

4. The multiple-gate semiconductor structure of claim 1, wherein said fin is rounded at two top corners.

5. The multiple-gate semiconductor structure of claim 1, wherein said gate dielectric layer comprises silicon oxide.

6. The multiple-gate semiconductor structure of claim 1, wherein said gate dielectric layer comprises silicon oxynitride.

7. The multiple-gate semiconductor structure of claim 1, wherein said gate dielectric layer comprises a high permittivity material selected from the group consisting of $La_2O_3$, HfON, $Al_2O_3$, $HfO_2$ and $ZrO_2$.

8. The multiple-gate semiconductor structure of claim 7, wherein said high permittivity material having a relative permittivity of at least 5.

9. The multiple-gate semiconductor structure of claim 1, wherein said gate dielectric layer having a thickness between 3 Å and 100 Å.

10. The multiple-gate semiconductor structure of claim 1, wherein said gate dielectric layer having a first thickness on said fin sidewall surfaces and a second thickness on said fin top surface, said first thickness being different from said second thickness.

11. The multiple-gate semiconductor structure of claim 1, wherein said second thickness is smaller than said first thickness.

12. The multiple-gate semiconductor structure of claim 1, wherein said gate dielectric layer having a thickness on the top surface of said fin less than 20 Å.

13. The multiple-gate semiconductor structure of claim 1, wherein said gate electrode comprises poly-crystalline silicon.

14. The multiple-gate semiconductor structure of claim 1, wherein said gate electrode comprises poly-crystalline silicon germanium.

15. The multiple-gate semiconductor structure of claim 1, wherein said gate electrode comprises a metal.

16. The multiple-gate semiconductor structure of claim 1, wherein said source and drain islands each comprises a lightly doped or extension region.

17. The multiple-gate semiconductor structure of claim 1, wherein said source and drain islands are strapped by a conductive material selected from the group consisting of metals and suicides.

18. The multiple-gate semiconductor structure of claim 1, wherein contacts between said conductive material and said source and drain islands are on at least one of the sidewall and top surfaces of the fin.

* * * * *